US009361820B2

(12) United States Patent
Lee et al.

(10) Patent No.: US 9,361,820 B2
(45) Date of Patent: Jun. 7, 2016

(54) APPARATUS AND METHOD FOR INSPECTING SHORT CIRCUIT DEFECTS

(71) Applicant: Samsung Display Co., Ltd., Yongin, Gyeonggi-Do (KR)

(72) Inventors: June-Woo Lee, Yongin (KR); Jae-Beom Choi, Yongin (KR); Kwan-Wook Jung, Yongin (KR); Sung-Soo Choi, Yongin (KR); Seong-Jun Kim, Yongin (KR); Guang-Hai Jin, Yongin (KR); Ga-Young Kim, Yongin (KR); Jee-Hoon Kim, Yongin (KR)

(73) Assignee: Samsung Display Co., Ltd., Giheung-Gu, Yongin-si, Gyeonggi-do (KR)

( * ) Notice: Subject to any disclaimer, the term of this patent is extended or adjusted under 35 U.S.C. 154(b) by 774 days.

(21) Appl. No.: 13/672,031

(22) Filed: Nov. 8, 2012

(65) Prior Publication Data

US 2013/0307557 A1 Nov. 21, 2013

(30) Foreign Application Priority Data

May 18, 2012 (KR) ........................ 10-2012-0053155

(51) Int. Cl.
*G01R 31/02* (2006.01)
*G06F 3/045* (2006.01)
*G09G 3/00* (2006.01)
*G09G 3/32* (2016.01)

(52) U.S. Cl.
CPC .............. *G09G 3/006* (2013.01); *G09G 3/3233* (2013.01); *G09G 2300/0819* (2013.01); *G09G 2300/0852* (2013.01)

(58) Field of Classification Search
CPC ....... G06F 3/044; G01R 27/2605; G09G 3/00
USPC .................................. 324/539–544, 658–690
See application file for complete search history.

(56) References Cited

U.S. PATENT DOCUMENTS

| | | | | |
|---|---|---|---|---|
| 6,670,953 | B1 * | 12/2003 | Ozawa | 345/211 |
| 7,132,842 | B2 * | 11/2006 | Miyagawa | G09G 3/006 324/760.02 |
| 2005/0140306 | A1 * | 6/2005 | Park | 315/169.3 |
| 2007/0046186 | A1 * | 3/2007 | Kim | 313/504 |
| 2011/0279128 | A1 | 11/2011 | Staudt | |

FOREIGN PATENT DOCUMENTS

| | | |
|---|---|---|
| KR | 10-2005-0065947 A | 6/2005 |
| KR | 10-2007-0093229 A | 9/2007 |

* cited by examiner

*Primary Examiner* — Jermele M Hollington
*Assistant Examiner* — Farhana Hoque
(74) *Attorney, Agent, or Firm* — Robert E. Bushnell, Esq.

(57) ABSTRACT

A method of inspecting a short circuit defect between first wires extending in a first direction and a second direction intersecting the first direction and second wires extending in the first or second direction, the method including inspecting a short circuit defect between the first and second wires by using a potential difference monitored only in the second wires.

11 Claims, 10 Drawing Sheets

APPARATUS AND METHOD FOR INSPECTING SHORT CIRCUIT DEFECTS

CLAIM PRIORITY

This application makes reference to, incorporates the same herein, and claims all benefits accruing under 35 U.S.C. §119 from an application earlier filed in the Korean Intellectual Property Office on 18 May 2012 and there duly assigned Serial No. 10-2012-0053155.

BACKGROUND OF THE INVENTION

1. Field of the Invention

The present invention generally relates to a method of inspecting a short circuit defect, a method of inspecting a short circuit defect of a display apparatus, and a method of inspecting a short circuit defect of an organic light emitting display apparatus.

2. Description of the Related Art

Recently, display apparatuses have been replaced with portable thin film flat panel display apparatuses. An organic light emitting display apparatus is a self-emitting display apparatus and has a larger viewing angle, better contrast characteristics, and a faster response speed, compared to other flat panel display apparatuses. Thus, the organic light emitting display apparatus has drawn attention as a next-generation display apparatus.

The above information disclosed in this Related Art section is only for enhancement of understanding of the background of the invention and therefore it may contain information that does not form the prior art that is already known to a person of ordinary skill in the art.

SUMMARY OF THE INVENTION

One or more aspects of the present invention provide a method of easily inspecting an electrical short circuit defect.

According to an aspect of the present invention, there is provided a method of inspecting a short circuit defect between first wires extending in a first direction and a second direction intersecting the first direction and second wires extending in the first or second direction, the method including inspecting a short circuit defect between the first and second wires by using a potential difference monitored only in the second wires.

If both ends of each of the second wires extend to be floated, a defective line may be detected by respectively connecting a power receiving member and a power feeding member to both ends of one of the second wires and primarily monitoring a potential difference between regions of the second wire that are connected to the power receiving member and the power feeding member while sequentially applying a voltage to second wires adjacent to the second wire.

A location of the short circuit defect of the defective line detected through the primary monitoring may be detected by connecting the power receiving member and the power feeding member to both ends of the defective line, and secondarily monitoring a potential difference between regions of the defective line that are connected to the power receiving member and the power feeding member while applying a voltage to the defective line.

If the second wires extend in such a manner that one end of each of the second wires is floated and another end of each of the second wires may be connected to a common line, then a defective line may be detected by respectively connecting a power receiving member and a power feeding member to a region of the floated end and a region of the connected end of one of the second wires, and primarily monitoring a potential difference between the regions of the second wire connected to the power receiving member and the power feeding member while sequentially applying a voltage to second wires adjacent to the second wire.

A location of the short circuit defect of the defective line detected through the primary monitoring may be detected by respectively connecting the power receiving member and the power feeding member to a region of the floated end and a region of the connected end of the defective line, and secondarily monitoring a potential difference between the regions of the defective line connected to the power receiving member and the power feeding member while applying a voltage to the defective line.

According to another aspect of the present invention, there is provided a method of inspecting a short circuit defect between first wires and second wires of a display apparatus which include a plurality of pixels, the first wires connected to the plurality of pixels and extending in a first direction and a second direction intersecting the first direction, and the second wires connected to the plurality of pixels and extending in the first or second direction, the method including inspecting a short circuit defect between the first wires and the second wires by using a potential difference monitored only in the second wires.

The first wires may include first power supply lines extending in the first direction, the first power supply lines for supplying power to the plurality of pixels and second power supply lines extending in the second direction, the second power supply lines for supplying power to the plurality of pixels.

The first and second power supply lines may be disposed in a mesh fashion.

The second wires may include scan lines for supplying scan signals to the plurality of pixels.

The second wires may include data lines for supplying data signals to the plurality of pixels.

If the second wires extend in such a manner that both ends of each of the second wires are floated, then a defective line may be detected by respectively connecting a power receiving member and a power feeding member to regions of the both ends of one of the second wires, and primarily monitoring a potential difference between the regions of the second wire connected to the power receiving member and the power feeding member while sequentially applying a voltage to second wires adjacent to the second wire.

A location of the short circuit defect of the defective line detected through the primary monitoring may be detected by connecting the power receiving member and the power feeding member to regions of both ends of the defective line, and secondarily monitoring a potential difference between the regions of the defective line connected to the power receiving member and the power feeding member while applying a voltage to the defective line.

If the second wires extend in such a manner that one end of each of the second wires is floated and another end of each of the second wires may be connected to a common line, then a defective line may be detected by respectively connecting a power receiving member and a power feeding member to a region of the floated end and a region of the connected end of one of the second wires, and primarily monitoring a potential difference between the regions of the second wire connected to the power receiving member and the power feeding member while sequentially applying a voltage to second wires adjacent to the second wire.

A location of the short circuit defect of the defective line detected through the primary monitoring may be detected by respectively connecting the power receiving member and the power feeding member to a region of the floated end and a region of the connected end of the defective line, and secondarily monitoring a potential difference between the regions of the defective line connected to the power receiving member and the power feeding member while sequentially applying a voltage to the defective line.

According to another aspect of the present invention, there is provided a method of inspecting a short circuit defect between first power supply lines and second wires or between second power supply lines and the second wires in an organic light emitting display apparatus which includes a plurality of pixels each including a pixel electrode, an intermediate layer including an organic emission layer, and an opposite electrode, the first power supply lines connected to the plurality of pixels and extending in a first direction, the first power supply lines for supplying power to the plurality of pixels, the second power supply lines connected to the plurality of pixels and extending in a second direction intersecting the first direction, the second power supply lines for supplying power to the plurality of pixels, and the second wires connected to the plurality of pixels and extending in the first or second direction, the second wires for supplying signals to the plurality of pixels, the method including inspecting a short circuit defect between the first power supply lines and the second wires or between the second power supply lines and the second wires by using a potential difference monitored only in the second wires.

A defective line may be detected by respectively connecting a power receiving member and a power feeding member to both ends of one of the second wires, and monitoring a potential difference between regions of the second wire connected to the power receiving member and the power feeding member by sequentially applying a voltage to second wires adjacent to the second wire.

If one end of each of the second wires is floated and another end of each of the second wires is connected to a common line, then the power feeding member may be disposed farther from the ends of the second wires connected to the common line, and the power receiving member may be disposed adjacent to the ends of the second wires connected to the common line.

Each of the plurality of pixels included in the organic light emitting display apparatus may include at least two transistors and at least one capacitor.

The second wires may include at least one from among a scan line for supplying a scan signal to the plurality of pixels, a data line for supplying a data signal to the plurality of pixels, a control line for supplying a control signal to the plurality of pixels, and a writing line for supplying a writing signal to the plurality of pixels.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
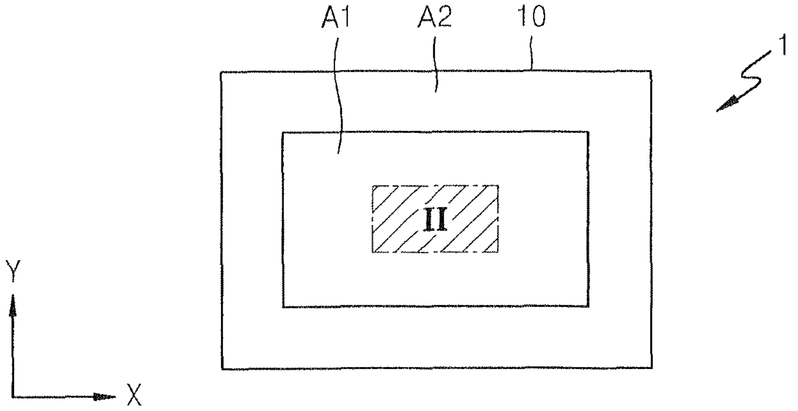
FIG. 1 is a schematic plan view of an organic light emitting display apparatus according to an embodiment of the present invention.

Hereinafter, exemplary embodiments of the present invention will be described in greater detail with reference to the accompanying drawings. As those skilled in the art would realize, the described embodiments may be modified in various different ways, all without departing from the spirit or scope of the principles for the present invention.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. Alternatively, when an element is referred to as being "directly on" another element, there are no intervening elements present. As used herein, expressions such as "at least one of," when preceding a list of elements, modify the entire list of elements and do not modify the individual elements of the list.

In order to clarify the present invention, elements extrinsic to the description are omitted from the details of this description, and like reference numerals refer to like elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

An organic light-emitting display apparatus may include an intermediate layer, a first electrode, and a second electrode. The intermediate layer may include an organic emission layer. When a voltage is applied to the first and second electrodes, visible light is emitted from the organic emission layer.

Various wires are installed in an organic light emitting display apparatus to drive the organic light emitting display apparatus. From among the various wires, some wires may be disposed on different layers to overlap with one another. When a short circuit defect occurs in overlapped regions where the wires overlap, the overlapping wires should be repaired.

However, it is not easy to detect a location of a short circuit defect occurring on such overlapping wire regions. In particular, as the number of wires increases and wires have a more complicated structure, inspecting an organic light emitting display apparatus may become increasingly difficult.

Figure 2:
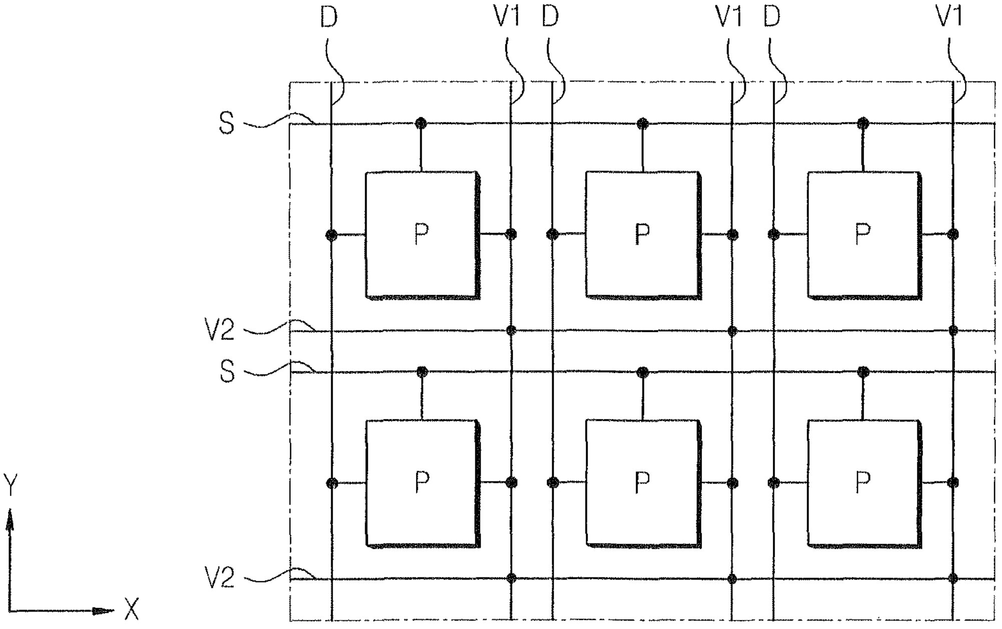
FIG. 2 is a diagram schematically illustrating a structure of wires included in a region II of FIG. 1, according to an embodiment of the present invention.

FIG. 1 is a schematic plan view of an organic light emitting display apparatus 1 according to an embodiment of the present invention. FIG. 2 is a diagram schematically illustrating a structure of wires included in a region II of FIG. 1, according to an embodiment of the present invention.

Referring to FIGS. 1 and 2, in the organic light emitting display apparatus 1 according to the current exemplary embodiment, a display region A1 and a non-display region A2 are formed on a substrate 10.

The display region A1 displays an image therein and may be disposed in a region of the substrate 10 including a center of the substrate 10. The non-display region A2 may be disposed on the substrate 10 to surround the display region A1.

A plurality of pixels P forming an image are included in the display region A1.

The plurality of pixels P may be defined as scan lines S extending in a first direction (X-axis direction) and data lines D extending in a second direction (Y-axis direction) perpendicular to the first direction (X-axis direction). A data signal provided from a data driver (not shown) included in the non-display region A2 is supplied to the plurality of pixels P via the data lines D, and a scan signal provided from a scan driver (not shown) included in the non-display region A2 is supplied to the plurality of pixels P via the scan lines S. Although FIG. 2 illustrates that the data lines D extend in the second direction (Y-axis direction) and the scan lines S extend in the first direction (X-axis direction), the present invention is not limited thereto. In other words, the directions in which the data lines D and the scan lines S respectively extend may be switched to each other.

The plurality of pixels P are connected to first power supply lines V1 extending in the second direction (Y-axis direction). A first power supply voltage ELVDD(t) (see FIG. 3) provided from a first power supply driver (not shown) included in the non-display region A2 may be applied to the plurality of pixels P via the first power supply lines V1. Although not shown in FIG. 2, a second power supply voltage ELVSS(t) (see FIG. 3) may be applied to the plurality of pixels P. The plurality of pixels P control the amount of current supplied to a second power supply voltage source ELVSS(t) from a first power supply voltage ELVDD(t) via an organic light emitting diode OLED of FIG. 3, according to a data signal. Then, the organic light emitting diode OLED generates light having a desired brightness.

Second power supply lines V2 extending in the first direction (X-axis direction) are connected to the first power supply lines V1. For example, the first and second power supply lines V1 and V2 may be connected to one another in a mesh fashion. A voltage drop (IR drop) may occur in the first power supply voltages line V1 due to resistance when the first power supply lines V1 are long. This problem may be solved by connecting the second power supply lines V2 to the first power supply lines V1.

Figure 3:
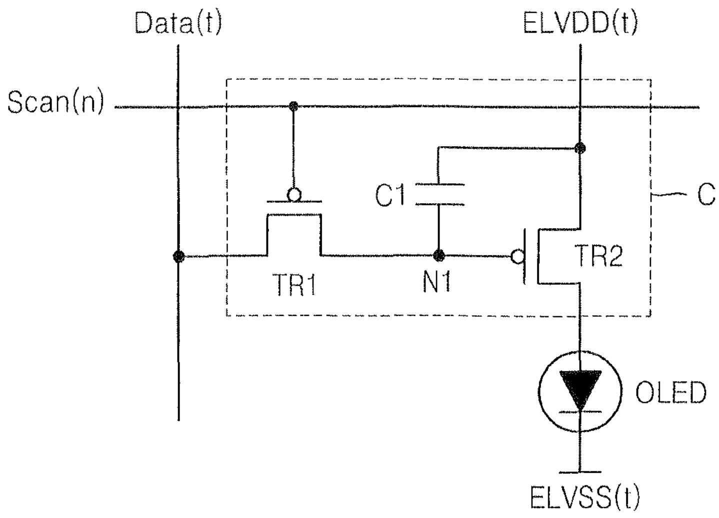
FIG. 3 is a circuit diagram of one of pixels illustrated in FIG. 2, according to an embodiment of the present invention.

FIG. 3 is a circuit diagram of one of the pixels P illustrated in FIG. 2, according to an embodiment of the present invention.

Referring to FIG. 3, the pixel P includes the organic light emitting diode OLED, and a pixel circuit C for supplying current to the organic light emitting diode OLED.

In the organic light emitting diode OLED, a pixel electrode may be connected to the pixel circuit C and an opposite electrode may be connected to the second power supply voltage source ELVSS(t). The organic light emitting diode OLED generates light having a brightness corresponding to current supplied from the pixel circuit C.

An active matrix organic light emitting display apparatus includes at least two transistors and at least one capacitor. In detail, the active matrix organic light emitting display apparatus includes a switching transistor for delivering a data signal, a driving transistor for driving an organic light emitting diode according to the data signal, and a capacitor for maintaining a data voltage constant.

Referring to FIGS. 2 and 3, in a first transistor TR1, a gate electrode may be connected to a scan line S, a first electrode may be connected to a data line D, and a second electrode may be connected to a first node N1. That is, a scan signal Scan(n) may be supplied to the gate electrode of the first transistor TR1 and a data signal Data(t) may be supplied to the first electrode of the first transistor TR1.

In a second transistor TR2, a gate electrode may be connected to the first node N1, a first electrode may be connected to the first power supply voltage source ELVDD(t), and a second electrode may be connected to the pixel electrode of the organic light emitting diode OLED. The second transistor TR2 acts as a driving transistor.

A first capacitor C1 may be connected between the first node N1 and the first electrode of the second transistor TR2, i.e., the first power supply voltage source ELVDD(t).

Figure 4:
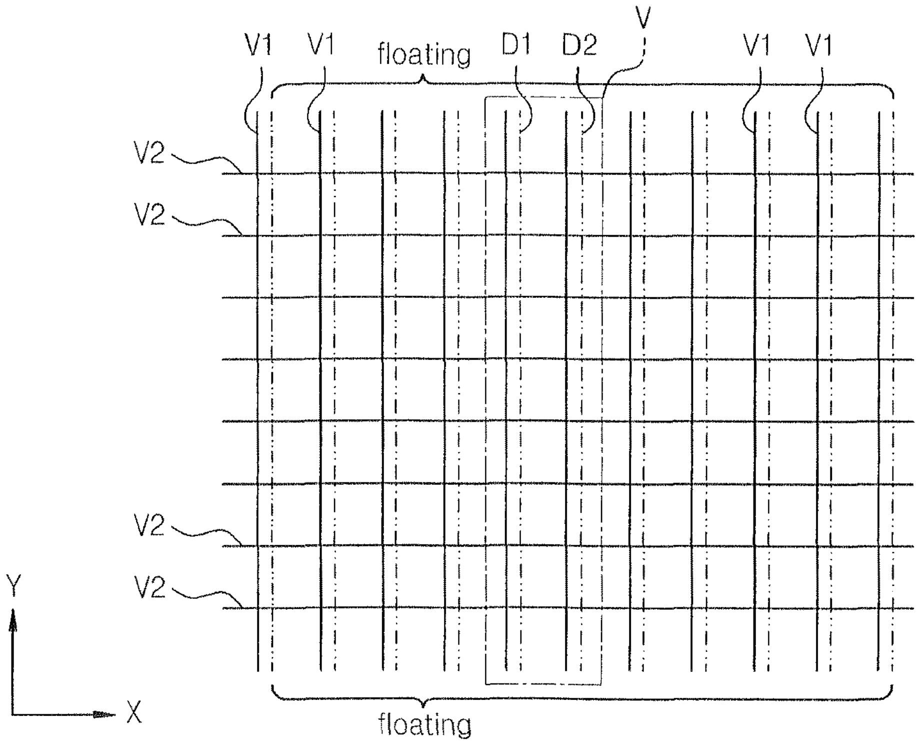
FIG. 4 is a diagram schematically illustrating some wires included in the organic light emitting display apparatus of FIG. 2, according to an embodiment of the present invention.

FIG. 4 is a diagram schematically illustrating some wires included in the organic light emitting display apparatus 1 of FIG. 2, according to an embodiment of the present invention. For convenience of explanation, only data lines D1 and D2, first power supply lines V1, and second power supply lines V2 from among the wires included in the organic light emitting display apparatus 1 are illustrated in FIG. 4.

The first power supply lines V1 and the second power supply lines V2 are electrically connected to one another in the mesh fashion. The data lines D1 and D2 extend in a direction parallel to the first power supply lines V1, i.e., the second direction (Y-axis direction). In the current embodiment, both ends of each of the data lines D1 and D2 are floated.

In the structure of the wires, a short circuit may occur since one of the data lines D1 and one of the second power supply lines V2 are connected, for example, due to undesired particles generated during the manufacture of the organic light emitting display apparatus 1, as will be described in detail with reference to FIG. 5 below.

Figure 5:
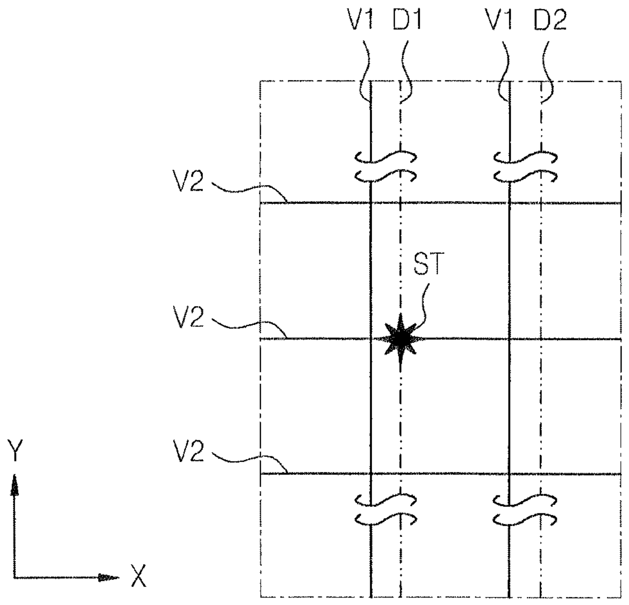
FIG. 5 is an enlarged view of a region V of FIG. 4.

FIG. 5 is an enlarged view of a region V of FIG. 4. Referring to FIG. 5, a short circuit defect ST occurs in a region where a data line D1 from among the data lines D1 and D2 overlaps with one of the second power supply lines V2, due to foreign substances, e.g., undesired particles. To improve image quality of the organic light emitting display apparatus 1, a repair process should be performed to rectify the short circuit defect ST. To perform the repair process, a process of detecting a location of the short circuit defect ST should be first performed.

Figure 6A:
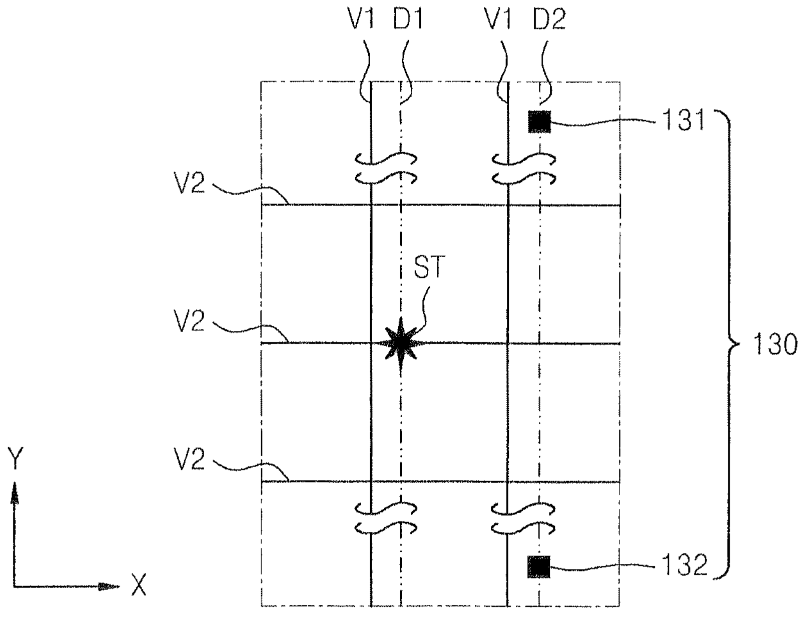
FIGS. 6A to 6C are diagrams schematically illustrating a method of inspecting a short circuit defect of the organic light emitting display apparatus of FIG. 2, according to an embodiment of the present invention.
Figure 6B:
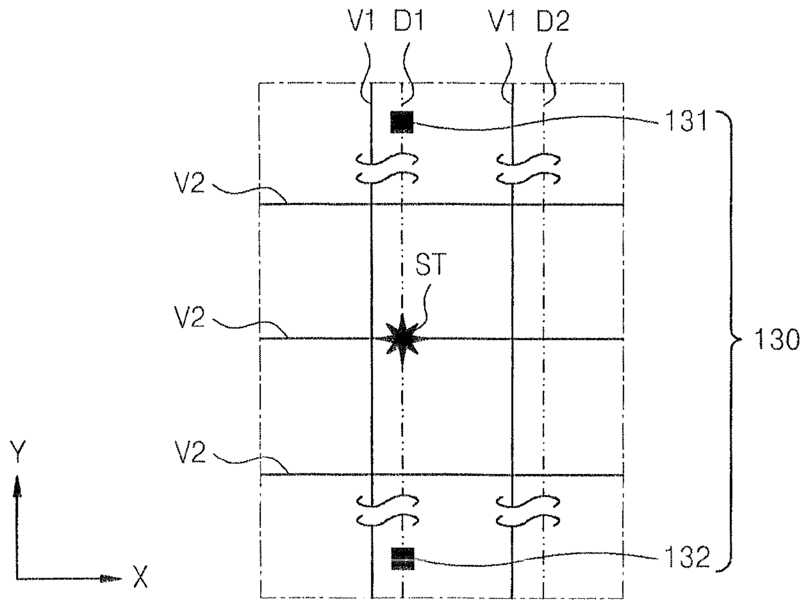
Figure 6C:
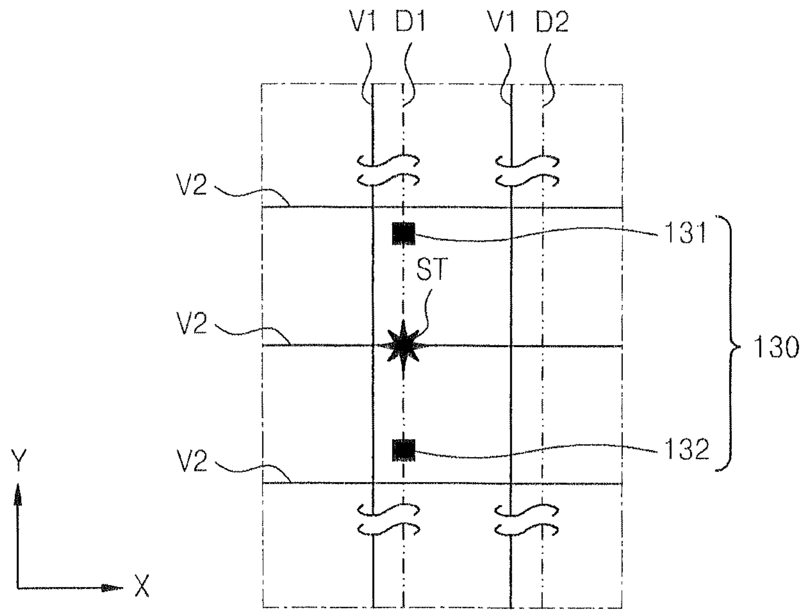

FIGS. 6A to 6C are diagrams schematically illustrating a method of inspecting a short circuit defect of the organic light emitting display apparatus 1 of FIG. 2, according to an embodiment of the present invention.

Referring to FIG. 6A, a test device 130 including a power feeding member 131 and a power receiving member 132 is prepared. Then, the power feeding member 131 and the power receiving member 132 are connected to both ends of a data line D2. In the current embodiment, since both ends of each of the plurality of data lines D1 and D2 are floated, the locations of the power feeding member 131 and the power receiving member 132 illustrated in FIG. 6A may be switched to each other.

In this case, the power feeding member 131 and the power receiving member 132 are not connected to the first power supply lines V1 and the second power supply lines V2. Since the first power supply line V1 and the second power supply line V2 are connected in the mesh fashion, current may flow through all the first and second power supply lines V1 and V2 when a voltage may be applied to inspect the organic light emitting display apparatus 1. Thus, it is difficult to determine whether a short circuit defect occurs in the organic light emitting display apparatus 1.

When a voltage is applied to the data line D2 by using the power feeding member 131 and the power receiving member 132, current flows through the data line D2. That is, a potential difference occurs at both ends of the data line D2. Such a potential difference may be monitored.

Then, referring to FIG. 6B, the power feeding member 131 and the power receiving member 132 are moved in the first direction (X-axis direction), and then connected to a data line D1 adjacent to the data line D2. Then, when a voltage is applied to the data line D1 by using the power feeding member 131 and the power receiving member 132, current flows through the data line D1. That is, a potential difference occurs at both ends of the data line D1. Such a potential difference may be monitored. In this case, when a short circuit defect ST occurs in a region where the data line D1 and one of the second power supply lines V2 overlap with each other, a potential difference monitored at the both ends of the data line D1 is different from a potential difference monitored at the both ends of the data line D2.

By sequentially inspecting the data lines D1 and D2 as described above, it is possible to easily detect the data line D1 in which the short circuit defect ST occurs in a region overlapping with the second power supply line V2.

Then, referring to FIG. 6C, a potential difference between regions of the data line D1 connected to the power feeding member 131 and the power receiving member 132 may be monitored by applying a voltage to the data line D1 having the short circuit defect ST while sequentially moving the power feeding member 131 and the power receiving member 132 on the data line D1 in the second direction (Y-axis direction). In this case, a potential difference near the location of the short circuit defect ST on the data line D1 is different from those near the other locations on the data line D1. Thus, the location of the short circuit defect ST on the data line D1 may be easily detected.

After the data line D1 having the short circuit defect ST and the location of the short circuit defect ST are detected as described above, a repair process including laser cutting may be performed on the data line D1.

Figure 7:
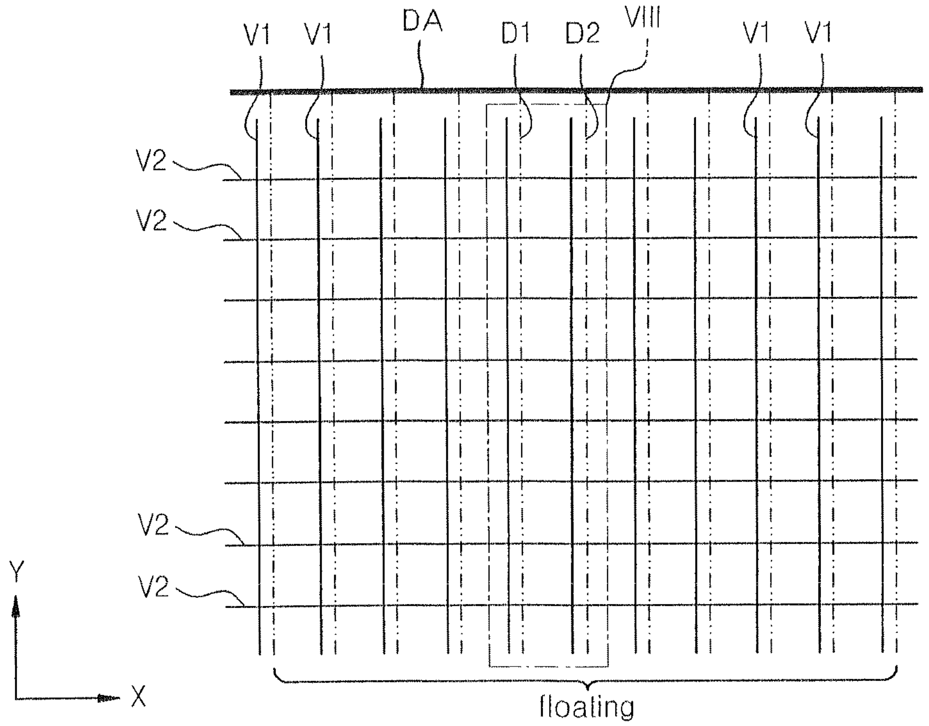
FIG. 7 is a diagram schematically illustrating some wires included in the organic light emitting display apparatus of FIG. 2, according to another embodiment of the present invention.

FIG. 7 is a diagram schematically illustrating some wires included in the organic light emitting display apparatus 1 of FIG. 2, according to another embodiment of the present invention. Referring to FIG. 7, first power supply lines V1 and second power supply lines V2 are disposed in the mesh fashion, one end of each of a plurality of data lines D1 and D2 may be floated, and another end of each of the plurality of data lines D1 and D2 may be connected to a common line DA.

Here, that another end of each of the plurality of data lines D1 and D2 may be connected to a common line DA does not mean that a common data signal is supplied to all pixels. In other words, switches (not shown) may be installed between the plurality of data lines D1 and D2 and the common line DA so as to individually supply a data signal to the pixels.

Figure 8:
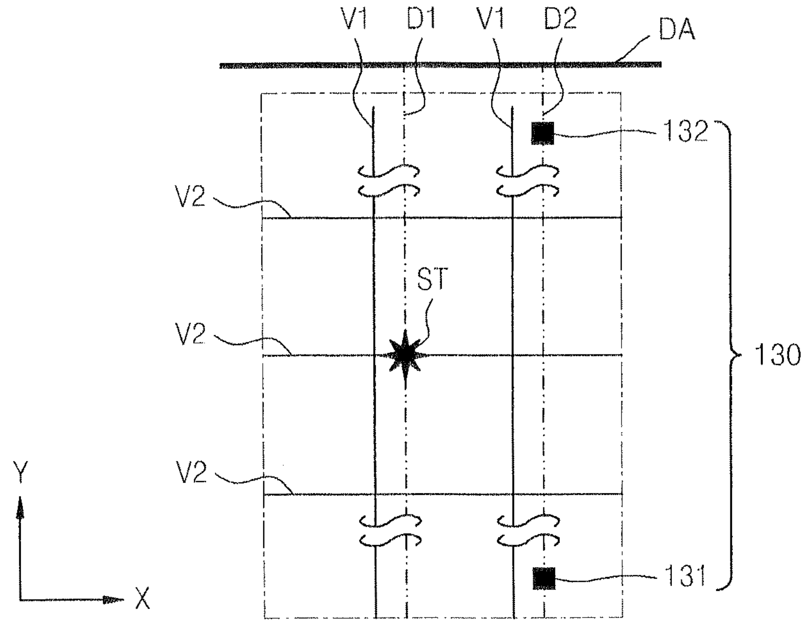
FIG. 8 is an enlarged view of a region VIII of FIG. 7.

FIG. 8 is an enlarged view of a region VIII of FIG. 7. Referring to FIG. 8, a test device 130 including a power feeding member 131 and a power receiving member 132 may be prepared. Then, the power feeding member 131 and the power receiving member 132 are connected to both ends of a data line D2.

In the current embodiment, when one end of each of the plurality of data lines D1 and D2 may be floated and another end of each of the plurality of data lines D1 and D2 may be connected to the common line DA, the power feeding member 131 may be disposed farther from the common line DA and the power receiving member 132 may be disposed near the common line DA. Then, when a voltage is applied to the data line D2 by using the power feeding member 131 and the power receiving member 132, current flows through the data line D2. That is, a potential difference occurs at both ends of the data line D2. Such a potential difference may be monitored. If the power feeding member 131 is connected to an upper portion of the data line D2, i.e., to be near the common line DA, and the power receiving member 132 may be connected to a lower portion of the data line D2, i.e., to be farther from the common line DA, then current is also likely to flow through the common line DA adjacent to the power feeding member 131 due to a voltage applied via the power feeding member 131. Thus, it is difficult to precisely monitor a potential difference at both ends of the data line D2. Accordingly, the power feeding member 131 may be disposed farther from the common line DA and the power receiving member 132 may be disposed near the common line DA.

Although not shown in the drawings, as described above with reference to FIG. 6B, a data line D1 in which a short circuit defect ST occurs in a region overlapping with a second power supply line V2 is detected by moving the power feeding member 131 and the power receiving member 132 in the first direction (X-axis direction), connecting the power feeding member 131 and the power receiving member 132 to the data line D1 adjacent to the data line D2, and then monitoring a potential difference at both ends of the data line D1. Then, as described above with reference to FIG. 6C, location of the short circuit defect ST in the data line D1 is detected by monitoring a potential difference between regions of the data line D1 connected to the power feeding member 131 and the power receiving member 132 by applying a voltage to the data line D1 having the short circuit defect ST while sequentially moving the power feeding member 131 and the power receiving member 132 on the data line D1 in the second direction (Y-axis direction).

Figure 9:
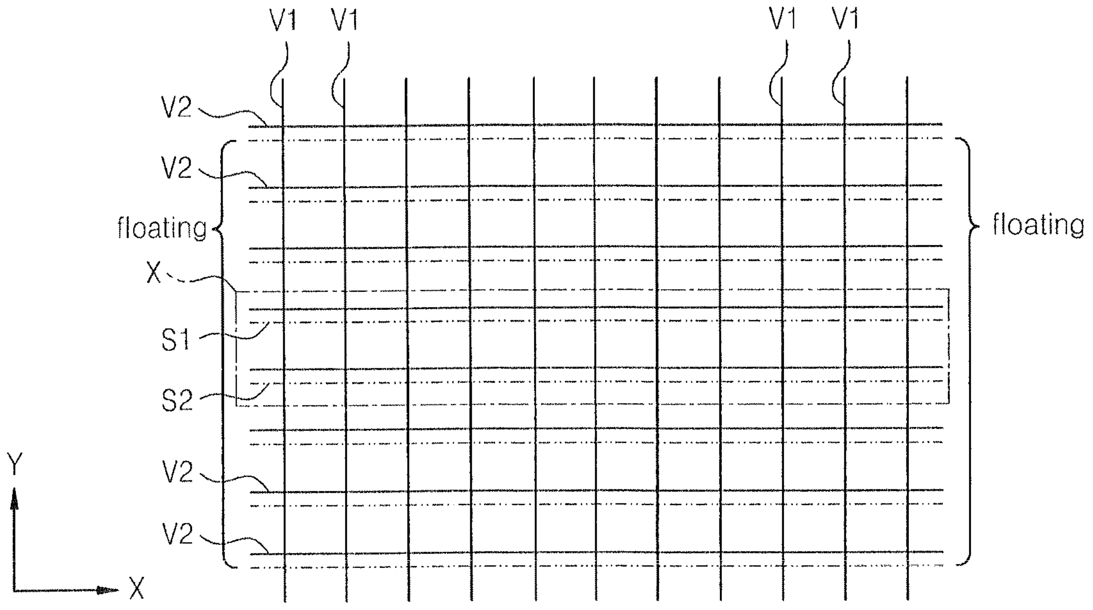
FIG. 9 is a diagram schematically illustrating some wires included in the organic light emitting display apparatus of FIG. 2, according to another embodiment of the present invention.

FIG. 9 is a diagram schematically illustrating some wires included in the organic light emitting display apparatus 1 of FIG. 2, according to another embodiment of the present invention. For convenience of explanation, only scan lines S1 and S2, first power supply lines V1, and second power supply lines V2 from among the wires included in the organic light emitting display apparatus 1 are illustrated in FIG. 9.

The first power supply lines V1 and the second power supply lines V2 are electrically connected to one another in the mesh fashion. The scan lines S1 and S2 extend in a direction parallel to the second power supply lines V2. In the current embodiment, both ends of each of the scan lines S1 and S2 are floated. In the structure of the wires, a short circuit may occur since one of the scan lines S1 and one of the first power supply lines V1 may be connected, for example, due to undesired particles generated during the manufacture of the organic light emitting display apparatus 1.

Figure 10:
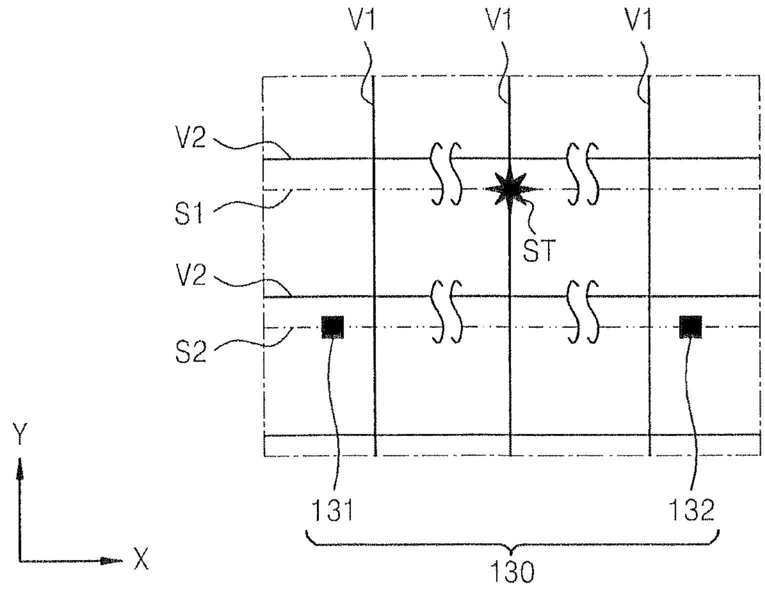
FIG. 10 is an enlarged view of a region X of FIG. 9.

FIG. 10 is an enlarged view of a region X of FIG. 9. Referring to FIG. 10, a test device 130 including a power feeding member 131 and a power receiving member 132 may be prepared. Then, the power feeding member 131 and the power receiving member 132 are connected to both ends of a scan line S2, and a potential difference between both ends of the scan line S2 may be monitored. Then, a scan line S1 in which a short circuit defect ST occurs in a region overlapping with one of the second power supply lines V1 may be detected by moving the power feeding member 131 and the power receiving member 132 in the second direction (Y-axis direction), connecting the power feeding member 131 and the power receiving member 132 to the scan line S1 adjacent to the scan line S2, and monitoring a potential difference at both ends of the scan line S1. Then, location of the short circuit defect ST in the scan line S1 may be detected by monitoring a potential difference between regions of the scan line S1 connected to the power feeding member 131 and the power receiving member 132 by applying a voltage to the scan line S1 having the short circuit defect ST while sequentially moving the power feeding member 131 and the power receiving member 132 on the scan line S1 in the first direction (X-axis direction).

Although FIG. 9 illustrates that both ends of each of the scan lines S1 and S2 are floated, the present invention is not limited thereto. In other words, the present invention may also be applied to a wire structure in which one end of each of the scan lines S1 and S2 may be floated and another end of each of the scan lines S1 and S2 may be connected to a common line (not shown).

Figure 11:
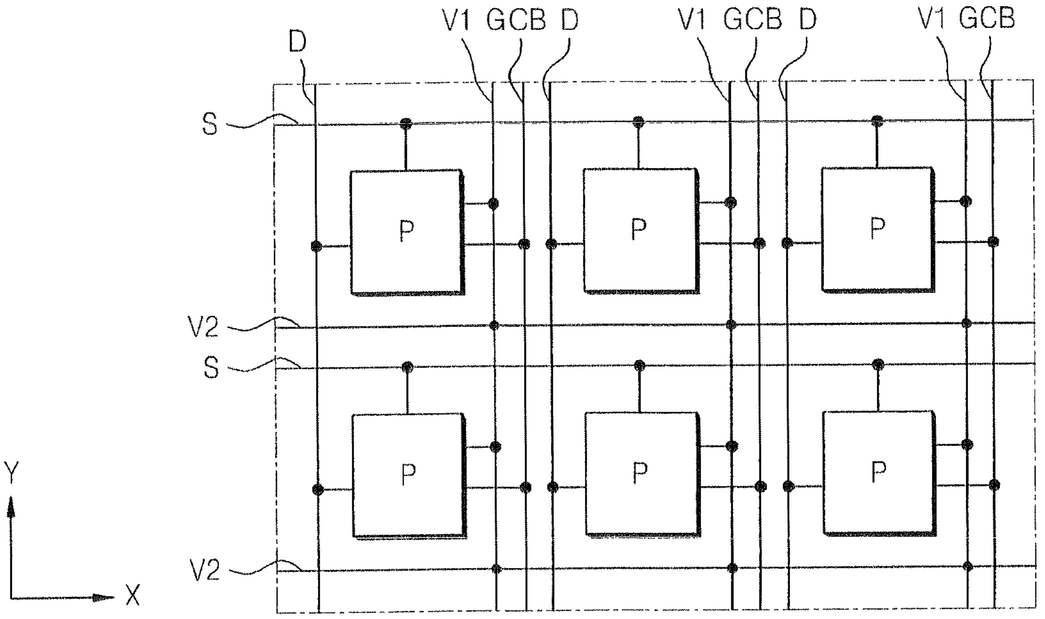
FIG. 11 is a diagram schematically illustrating a structure of wires included in the region II of FIG. 1, according to another embodiment of the present invention.
Figure 12:
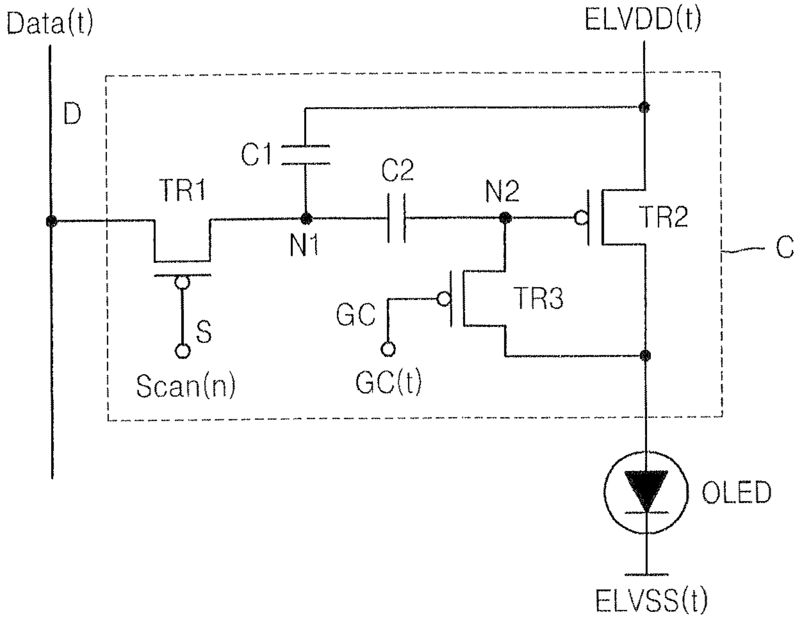
FIG. 12 is a circuit diagram of one of pixels illustrated in FIG. 11, according to another embodiment of the present invention.
Figure 13:
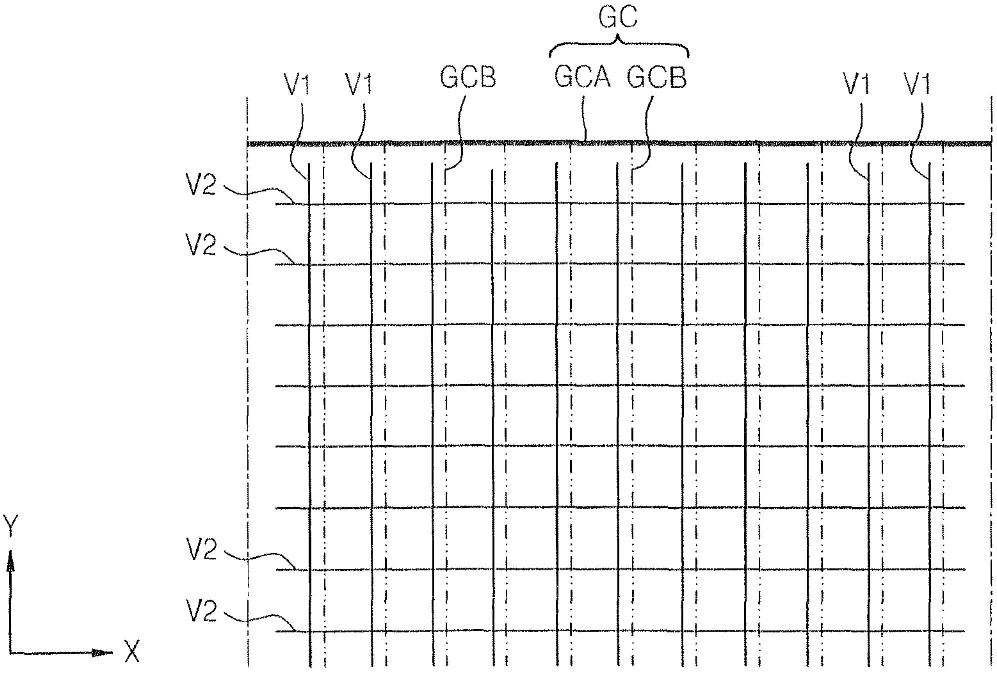
FIG. 13 is a diagram schematically illustrating some wires included in the organic light emitting display apparatus of FIG. 11, according to another embodiment of the present invention.

FIG. 11 is a diagram schematically illustrating a structure of wires included in the region II of FIG. 1, according to another embodiment of the present invention. FIG. 12 is a circuit diagram of one of pixels P illustrated in FIG. 11, according to another embodiment of the present invention. FIG. 13 is a diagram schematically illustrating some wires included in the organic light emitting display apparatus of FIG. 11, according to another embodiment of the present invention.

The organic light emitting display apparatus of FIG. 11 according to a current embodiment of the present invention will now be described focusing on the differences with the organic light emitting display apparatus of FIG. 2. Referring to FIG. 12, one of the pixels P included in the organic light emitting display apparatus according to the current embodiment includes three transistors TR1, TR2, and TR3, and two capacitors C1 and C2.

In the first transistor TR1, a gate electrode may be connected to a scan line S, a first electrode may be connected to a data line D, and a second electrode may be connected to a first node N1. That is, a scan signal Scan(n) and a data signal Data(t) are supplied to the gate electrode and the first electrode of the first transistor TR1, respectively.

In the second transistor TR2, a gate electrode may be connected to a second node N2, a first electrode may be connected to a first power supply voltage source ELVDD(t), and a second electrode may be connected to a pixel electrode of an organic light emitting diode OLED. The second transistor TR2 acts as a driving transistor.

The first capacitor C1 may be connected between the first node N1 and the first electrode of the second transistor TR2, i.e., the first power supply voltage source ELVDD(t). The second capacitor C2 may be connected between the first node N1 and the second node N2.

In the third transistor TR3, a gate electrode may be connected to a control line unit GC, a first electrode may be connected to the gate electrode of the second transistor TR2, and a second electrode may be connected to the pixel electrode of the organic light emitting diode OLED, i.e., the second electrode of the second transistor TR2. Thus, a control signal GC(t) may be supplied to the gate electrode of the third transistor TR3.

In the case of an organic light emitting display apparatus including two transistors and one capacitor as illustrated in FIG. 3, power consumption is low, but the intensity of current flowing through an organic light emitting diode may vary according to a deviation in a voltage between a gate and source of a driving transistor that drives the organic light emitting diode, i.e., a deviation in a threshold voltage of the driving transistor. Thus, display quality may be degraded. However, the organic light emitting display apparatus according to the current embodiment is capable of simultaneously and respectively supplying control signals GC(t) each having a predetermined voltage to the pixels P illustrated in FIG. 11, thereby reducing degradation of display quality, caused by the deviation in the threshold voltage.

Referring to FIG. 11, each of the pixels P may be connected to one of the scan lines S extending in the first direction (X-axis direction), one of the data lines D extending in the second direction (Y-axis direction) perpendicular to the first direction (X-axis direction), and one of first power supply lines V1 extending in the second direction (Y-axis direction). Second power supply lines V2 extending in the first direction (X-axis direction) are connected to the first power supply lines V1 in the mesh fashion.

In the current embodiment, each of the pixels P may be further connected to one of control lines GCB of the control line unit GB extending in the second direction (Y-axis direction). The control signals GC(t) each having the predetermined voltage may be respectively and simultaneously applied to the pixels P from a control signal driver (not shown) disposed in the non-display region A2 of FIG. 1 via the control lines GCB.

Referring to FIG. 13, the first power supply lines V1 and the second power supply line V2 are disposed in the mesh fashion, one end of the control line unit GC, i.e., one end of each of the control lines GCB, extends in the second direction (Y-axis direction) to be floated, and another end of the control line unit GC may be connected to a common line GCA. Thus, signals that branch off from a common signal received via the common line GCA may be supplied to the control lines GCB.

Although not shown, if a short circuit defect ST occurs in a region where one of the control lines GCB and one of the second power supply line V2 overlap with each other, due to a foreign substance, e.g., particles, then a power feeding member may be disposed farther from the common line GCA of the control line unit GC and a power receiving member may be disposed adjacent to the common line GCA. Then, a voltage may be sequentially applied to the control lines GCB by using the power feeding member and the power receiving member, and a potential difference may be monitored to detect the location of the short circuit defect ST of the control line GCB.

Although not shown in FIG. 13, a short circuit defect occurring between the data lines D and the second power supply lines V2 or between the scan lines S and the first power supply lines V1 may be detected as described above. Although in the current embodiment, the control lines GCB extend in the second direction (Y-axis direction, the present invention is not limited thereto and the control lines GCB may extend in the first direction (X-axis direction).

Figure 14:
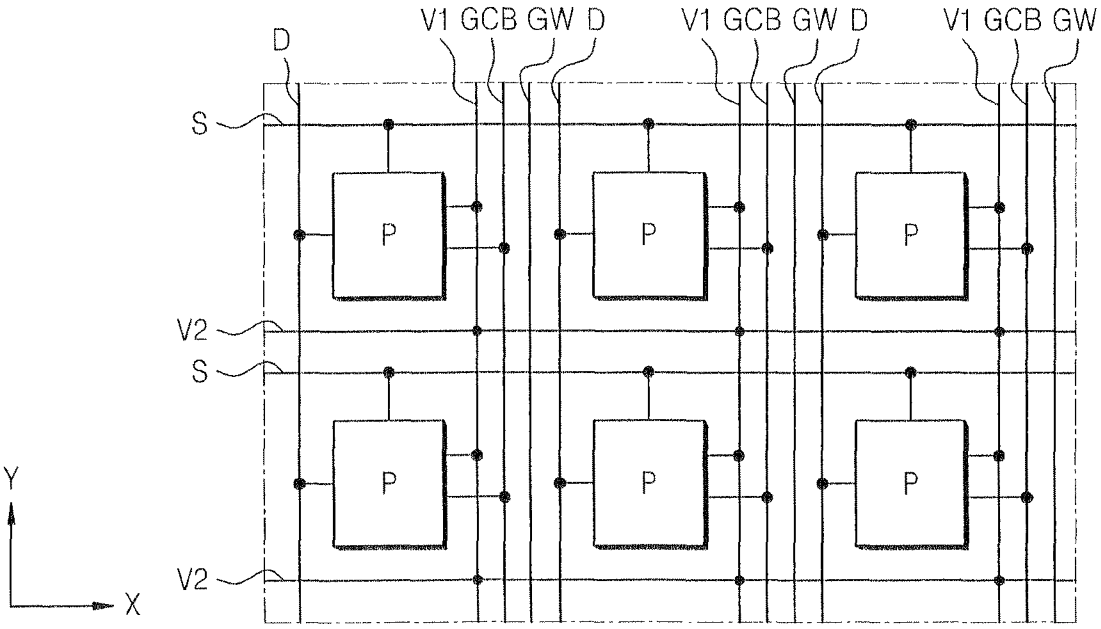
FIG. 14 is a diagram schematically illustrating a structure of wires included in the region II of FIG. 1, according to another embodiment of the present invention.
Figure 15:
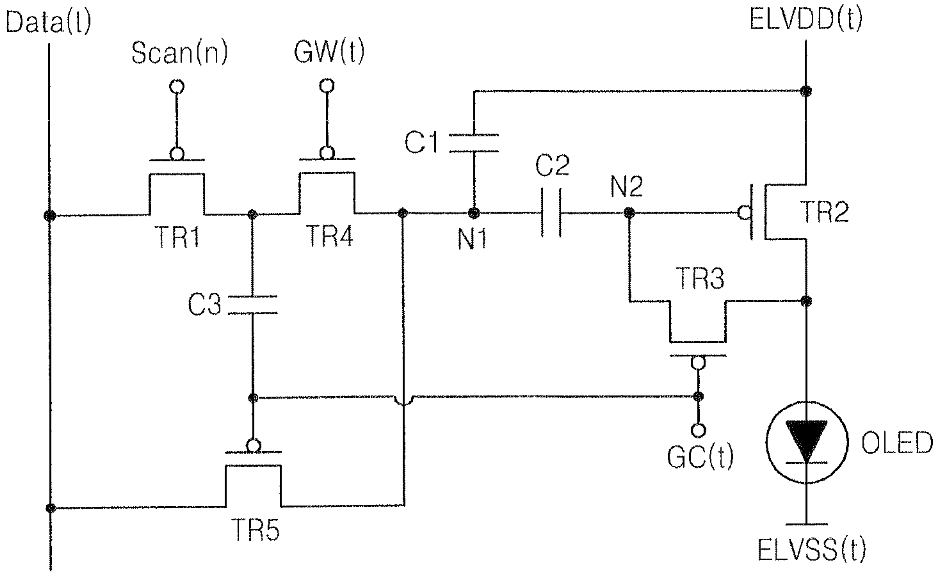
FIG. 15 is a circuit diagram of one of pixels illustrated in FIG. 14, according to another embodiment of the present invention.
Figure 16:
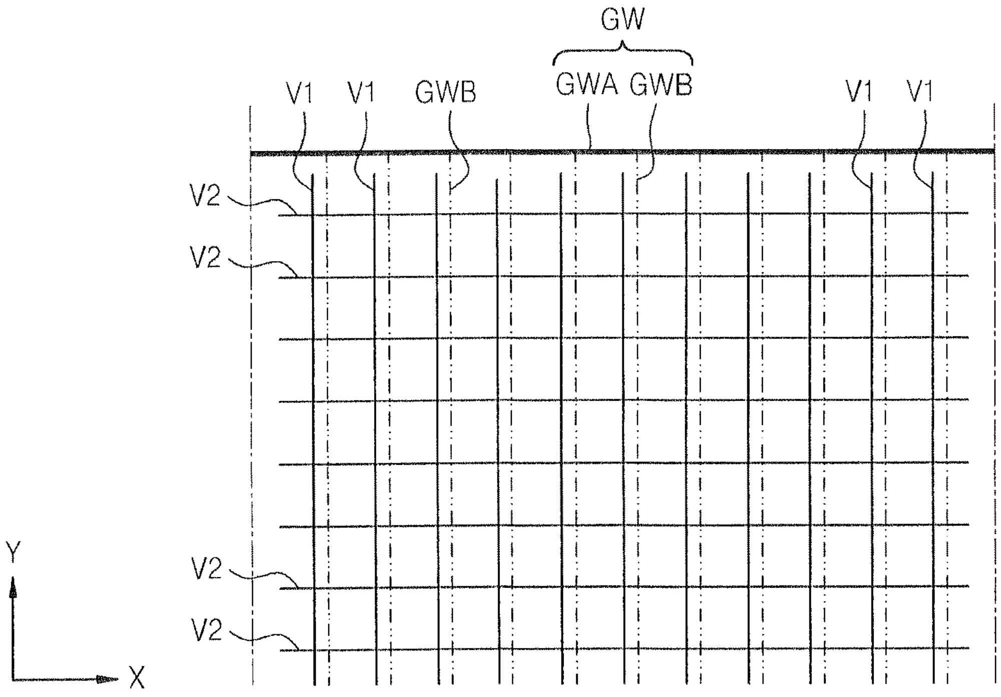
FIG. 16 is a diagram schematically illustrating some wires included in the organic light emitting display apparatus of FIG. 14, according to another embodiment of the present invention.

FIG. 14 is a diagram schematically illustrating a structure of wires included in the region II of FIG. 1, according to another embodiment of the present invention. FIG. 15 is a circuit diagram of one of pixels P illustrated in FIG. 14, according to another embodiment of the present invention. FIG. 16 is a diagram schematically illustrating some wires included in an organic light emitting display apparatus of FIG. 14, according to another embodiment of the present invention.

The organic light emitting display apparatus of FIG. 14 according to a current embodiment of the present invention will now be described focusing on the differences with the organic light emitting display apparatus of FIG. 11. Referring to FIG. 15, one of the pixels P included in the organic light emitting display apparatus according to the current embodiment includes five transistors TR1 to TR5, and three capacitors C1 to C3.

Compared to the pixel P of FIG. 12, the pixel P according to the current embodiment further includes the fourth and fifth transistors TR4 and TR5, and the third capacitor C3.

In the fourth transistor TR4, a gate electrode may be connected to a writing line unit GW to be supplied a writing signal GWB and writing line signals GW(t). The fourth transistor TR4 acts as a switching device having an additional data storage space to store data of an $(N+1)^{th}$ frame in the pixel P and compare the data of the $(N+1)^{th}$ frame with data of an $N^{th}$ frame.

A gate electrode of the fifth transistor TR5 may be connected to the third transistor TR3 to which a control signal GC(t) may be supplied. The fifth transistor TR5 is a bypass wire and switching device required to initialize the $N^{th}$ frame when emission of light from the $N^{th}$ frame ends. The control signal GC(t) may also be supplied to the fifth transistor TR5.

The third capacitor C3 stores the data of the $(N+1)^{th}$ frame.

Referring to FIG. 14, each of the pixels P may be connected to one of scan lines S extending in the first direction (X-axis direction), one of data lines D extending in the second direction (Y-axis direction) perpendicular to the first direction (X-axis direction), and one of first power supply lines V1 extending in the second direction (Y-axis direction). Second power supply lines V2 extending in the first direction (X-axis direction) are connected to the first power supply lines V1 in the mesh fashion.

Each of the pixels P may be further connected to one of control lines GCB and one of writing lines GWB that extend in the second direction (Y-axis direction).

Referring to FIG. 16, the first power supply lines V1 and the second power supply lines V2 are disposed in the mesh fashion, one end of the wiring line unit GW, i.e., one end of each of the writing lines GWB, extends in the second direction (Y-axis direction) to be floated, and another end of the writing line unit GW may be connected to a common line GWA. Thus, signals that branch off from a common signal received via the common line GWA may be supplied to the writing lines GWB.

Although not shown, if a short circuit defect ST occurs in a region where one of the writing lines GWB and one of the second power supply lines V2 overlap with each other, due to a foreign substance, e.g., particles, then a power feeding member may be disposed farther from the common line GWA of the writing line unit GW and a power receiving member may be disposed adjacent to the common line GWA. Then, a voltage may be sequentially applied to the writing lines GWB by using the power feeding member and the power receiving member, and a potential difference may be monitored to detect the location of the short circuit defect ST of the control line GCB.

Although not shown in FIG. 14, both ends of each of the writing lines GWB may be floated. In the current embodiment, the writing lines GWB extend in the second direction (Y-axis direction), but he present invention is not limited thereto and the writing lines GWB may extend in the first direction (X-axis direction).

Figure 17:
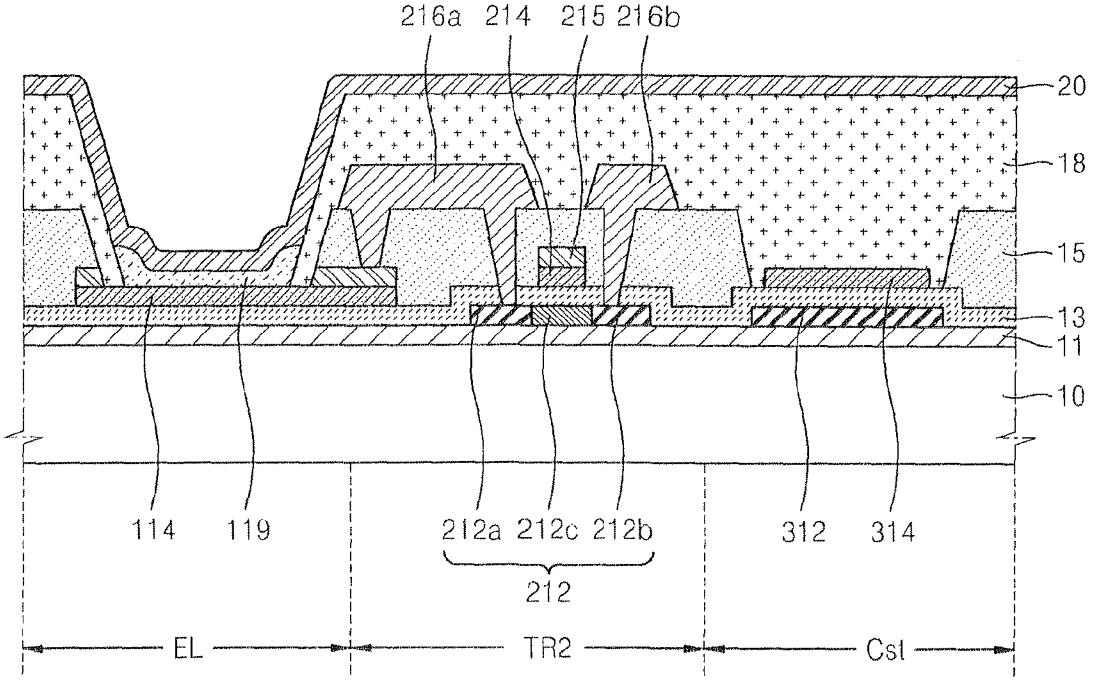
FIG. 17 is a cross-sectional view of some elements of each pixel of the organic light emitting display apparatus of FIG. 1, according to an embodiment of the present invention.

FIG. 17 is a cross-sectional view of some elements of each pixel of the organic light emitting display apparatus of FIG. 1, according to an embodiment of the present invention.

Referring to FIG. 17, a second transistor TR2 which may be a thin film driving transistor, a first capacitor Cst, and an organic light emitting diode EL are disposed on a substrate 10.

The substrate 10 may be formed of a $SiO_2$-based transparent glass material, but is not limited thereto and may be formed of a transparent plastic material. A buffer layer 11 may further be disposed on the substrate 10. The buffer layer 11 provides a flat surface on the substrate 10 and protects the substrate 10 against moisture and foreign substances. An active layer 212 of the second transistor TR2 may be formed on the buffer layer 11. The active layer 212 includes a source region **212*b*, a drain region 212*a*, and a channel region 212*c*. A gate insulating layer 13 may be disposed on the active layer 212. A first gate electrode layer 214 and a second gate electrode layer 215 that contain a transparent conductive material are sequentially disposed on a location on the gate insulating layer 13 corresponding to the channel region 212*c* of the active layer 212. A source electrode 216*b* and a drain electrode 216*a* are formed on the second gate electrode layer 215 between patterns of an interlayer insulating layer 15 to be connected to the source region 212*b* and the drain region 212*a* of the active layer, respectively. A pixel defining layer 18 may be formed on the interlayer insulating layer 15 to cover the source electrode 216*b* and the drain electrode 216*a*. A pixel electrode 114 may be formed on the buffer layer 11 and the gate insulating layer 13 by using a transparent conductive material used to form the first gate electrode layer 214. An intermediate layer 119 including an organic emission layer may be formed on the pixel electrode 114. An opposite electrode 20 may be formed as a common electrode on the intermediate layer 119. In the case of the organic light emitting display apparatus according to the current embodiment, the pixel electrode 114 may function as an anode and the opposite electrode 20 may function as a cathode, or vice versa. Although not shown in FIG. 17, a sealing member (not shown) may be disposed on the opposite electrode 20 to face one surface of the substrate 10**.

Various embodiments of the method of inspecting a short circuit defect of an organic light emitting display apparatus according to the present invention have been described above, but the present invention is not limited thereto. In other words, the technical idea of the present invention may also be applied to inspect a short circuit defect of any of various types of display apparatuses including an organic light emitting display apparatus. Furthermore, the present invention may be applied to inspect a short circuit defect of any of other electronic devices other than display apparatuses provided that one wire and another wire are connected in the mesh fashion.

With the method of inspecting a short circuit defect according to an embodiment of the present invention, it is possible to easily inspect a short circuit defect occurring between one wire and another wire that are connected in the mesh fashion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of inspecting a short circuit defect between first wires and second wires of a display apparatus which include a plurality of pixels, the method comprising:

inspecting a short circuit defect between the first wires and the second wires by using a potential difference monitored only in the second wires, wherein the first wires comprises:

first power supply lines extending in a first direction, the first power supply lines for supplying power to the plurality of pixels; and second power supply lines extending in a second direction intersecting the first direction and connected with the first power supply lines, the second power supply lines for supplying power to the plurality of pixels, wherein the second wires are different from the first and second power supply lines, wherein, when the second wires extend in such a manner that both ends of each of the second wires are floated, then a defective line is detected by respectively connecting a power receiving member and a power feeding member to regions of the both ends of one of the second wires, and primarily monitoring a potential difference between the regions of the second wire connected to the power receiving member and the power feeding member while sequentially and not simultaneously applying a voltage to second wires adjacent to the second wire.

2. The method of claim 1, wherein the first and second power supply lines are disposed in a mesh fashion.

3. The method of claim 1, wherein the second wires comprise scan lines for supplying scan signals to the plurality of pixels.

4. The method of claim 1, wherein the second wires comprise data lines for supplying data signals to the plurality of pixels.

5. The method of claim 1, wherein a location of the short circuit defect of the defective line detected through the primary monitoring is detected by connecting the power receiving member and the power feeding member to regions of both ends of the defective line, and secondarily monitoring a potential difference between the regions of the detective line connected to the power receiving member and the power feeding member while applying a voltage to the defective line.

6. A method of inspecting a short circuit defect between first wires and second wires of a display apparatus which include a plurality of pixels, the method comprising:

inspecting a short circuit defect between the first wires and the second wires by using a potential difference monitored only in the second wires, wherein the first wires comprises:

first power supply lines extending in a first direction, the first power supply lines for supplying power to the plurality of pixels; and second power supply lines extending in a second direction intersecting the first direction and connected with the first power supply lines, the second power supply lines for supplying power to the plurality of pixels, wherein the second wires are different from the first and second power supply lines, wherein, when the second wires extend in such a manner that one end of each of the second wires is floated and another end of each of the second wires is connected to a common line, then a defective line is detected by respectively connecting a power receiving member to a region of the connected end of one of the second wires and a power feeding member to a region of the floated end of one of the second wires, and primarily monitoring a potential difference between the regions of the second wire connected to the power receiving member and the power feeding member while sequentially applying a voltage to second wires adjacent to the second wire, wherein a location of the short circuit defect of the defective line detected through the primary monitoring is detected by respectively connecting the power receiving member and the power feeding member to a region of the floated end and a region of the connected end of the defective line, and secondarily monitoring a potential difference between the regions of the defective line connected to the power receiving member and the power feeding member while sequentially applying a voltage to the detective line.

7. The method of claim 6, wherein a location of the short circuit defect of the defective line detected through the primary monitoring is detected by respectively connecting the power receiving member and the power feeding member to a region of the floated end and a region of the connected end of the defective line, and secondarily monitoring a potential difference between the regions of the defective line connected to the power receiving member and the power feeding member while sequentially applying a voltage to the defective line.

8. A method of inspecting a short circuit defect between first power supply lines and second wires or between second power supply lines and the second wires in an organic light emitting display apparatus which includes a plurality of pixels each including a pixel electrode, an intermediate layer including an organic emission layer, and an opposite electrode, the first power supply lines connected to the plurality of pixels and extending in a first direction, the first power supply lines for supplying power to the plurality of pixels, the second power supply lines connected to the plurality of pixels and extending in a second direction intersecting the first direction and connected with the first power supply lines, the second power supply lines for supplying power to the plurality of pixels, and the second wires connected to the plurality of pixels and extending in the first or second direction, the second wires for supplying signals to the plurality of pixels, the method comprising, the second wires different from the first and second power supply lines:

inspecting a short circuit defect between the first power supply lines and the second wires or between the second power supply lines and the second wires by using a potential difference monitored only in the second wires, wherein a defective line is detected by respectively connecting a power receiving member and a power feeding member to both ends of one of the second wires, and monitoring a potential difference between regions of the second wire connected to the power receiving member and the power feeding member by sequentially and not simultaneously applying a voltage to second wires adjacent to the second wire.

9. The method of claim 8, wherein each of the plurality of pixels included in the organic light emitting display apparatus comprises at least two transistors and at least one capacitor.

10. The method of claim 8, wherein the second wires comprises at least one from among a scan line for supplying a scan signal to the plurality of pixels, a data line for supplying a data signal to the plurality of pixels, a control line for supplying a control signal to the plurality of pixels, and a writing line for supplying a writing signal to the plurality of pixels.

11. A method of inspecting a short circuit defect between first power supply lines and second wires or between second power supply lines and the second wires in an organic light emitting display apparatus which includes a plurality of pixels each including a pixel electrode, an intermediate layer including an organic emission layer, and an opposite electrode, the first power supply lines connected to the plurality of pixels and extending in a first direction, the first power supply lines for supplying power to the plurality of pixels, the second power supply lines connected to the plurality of pixels and extending in a second direction intersecting the first direction and connected with the first power supply lines, the second power supply lines for supplying power to the plurality of pixels, and the second wires connected to the plurality of pixels and extending in the first or second direction, the second wires for supplying signals to the plurality of pixels, the method comprising, the second wires different from the first and second power supply lines:

inspecting a short circuit defect between the first power supply lines and the second wires or between the second power supply lines and the second wires by using a potential difference monitored only in the second wires, wherein, when one end of each of the second wires is floated and another end of each of the second wires is connected to a common line, then the power feeding member is disposed farther from the ends of the second wires connected to the common line, and the power receiving member is disposed adjacent to the ends of the second wires connected to the common line.

* * * * *